Figure 1:
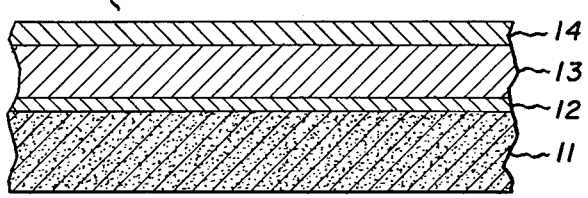

United States Patent [19]

Hale

[11] Patent Number: 4,497,874

[45] Date of Patent: Feb. 5, 1985

[54] COATED CARBIDE CUTTING TOOL INSERT

[75] Inventor: Thomas E. Hale, Warren, Mich.

[73] Assignee: General Electric Company, Detroit, Mich.

[21] Appl. No.: 489,287

[22] Filed: Apr. 28, 1983

[51] Int. Cl.³ .............................. B22F 3/00; B22F 5/00; B22F 7/00

[52] U.S. Cl. ...................................... 428/551; 75/238; 427/249; 428/548; 428/698; 501/87; 501/127

[58] Field of Search .......................... 75/238; 427/249; 428/548, 551, 698; 501/87, 127

[56] References Cited

U.S. PATENT DOCUMENTS

| Re. 28,485 | 7/1975 | Rix et al. | 428/457 |
|---|---|---|---|
| 2,036,245 | 4/1936 | Walter | 75/238 |
| 2,612,442 | 9/1952 | Goetzel | 428/555 |
| 3,147,542 | 9/1964 | Boeckeler | 428/457 |
| 3,564,683 | 2/1971 | Schedler et al. | 407/119 |
| 3,640,689 | 2/1972 | Glaski et al. | 428/627 |
| 3,684,585 | 8/1972 | Stroup et al. | 148/6 |
| 3,717,496 | 2/1973 | Kieffer et al. | 428/335 |
| 3,874,900 | 4/1975 | Post et al. | 148/16.5 |
| 3,971,656 | 7/1976 | Rudy | 419/16 |
| 3,999,954 | 12/1976 | Kolaska et al. | 428/545 |
| 4,018,631 | 4/1977 | Hale | 427/249 |
| 4,035,541 | 7/1977 | Smith et al. | 428/217 |
| 4,049,876 | 9/1977 | Yamamoto et al. | 428/565 |
| 4,052,530 | 10/1977 | Fonzi | 428/552 |
| 4,101,703 | 7/1978 | Schintlmeister | 428/216 |
| 4,150,195 | 4/1979 | Tobioka et al. | 428/548 |
| 4,162,338 | 7/1979 | Schintlmeister | 427/249 |
| 4,268,569 | 5/1981 | Hale | 428/215 |
| 4,277,283 | 7/1981 | Tobioka et al. | 75/238 |
| 4,334,928 | 6/1982 | Hara et al. | 75/237 |
| 4,442,169 | 4/1984 | Graham | 428/336 |
| 4,463,062 | 7/1984 | Hale | 75/242 |

FOREIGN PATENT DOCUMENTS 48-32734 5/1973 Japan .
57-92159 8/1982 Japan .
2095702 10/1982 United Kingdom .

OTHER PUBLICATIONS

Suzuki et al., Transactions of the Japan Institute of Metals, vol. 22, No. 11, (1981), pp. 758–764, (English).
Suzuki et al., Nippon Kinzoku Gakkai-shi, vol. 45, No. 1, pp. 95–99, 1981, Translation.
Hayashi et al., J. of Japan Society of Powder and Powder Metallurgy, vol. 29, No. 5, Jul. 1982, pp. 159–163, (English Abstract only).
Suzuki et al., Japan Society of Powder and Powder Metallurgy, vol. 29, No. 2, Feb. 1982, pp. 54–57, (English Abstract Only).
Suzuki et al., Japan Society of Powder and Powder Metallurgy, vol. 29, No. 1, Jan. 1982, pp. 25–29, (English Abstract Only).

Primary Examiner—Leland A. Sebastian
Attorney, Agent, or Firm—James J. Lichiello; Arthur E. Bahr; Ernest F. Chapman

[57] ABSTRACT

A coated carbide insert has a cobalt enriched zone at one decarburized surface, and a thin TiN transition layer over this surface. The cobalt enriched zone and the TiN layer cooperate to support additional thicker layers of hard wear resistant material such as TiC, TiN, and Al₂O₃.

15 Claims, 2 Drawing Figures

COATED CARBIDE CUTTING TOOL INSERT

CROSS-REFERENCE TO RELATED PATENT APPLICATION

This patent application relates to U.S. patent application Ser. No. 489,286 Filed Apr. 28, 1983 on behalf of Warren C. Yohe and entitled "IMPROVED COATED CARBIDE CUTTING TOOL INSERT", which patent application is assigned to the instant assignee.

BACKGROUND OF THE INVENTION

This invention relates to an improved coated carbide cutting tool insert, and more particularly to the combination of a support structure and a three layered coating on the insert. The inner and outer layers on the insert are of a nitride material. The intermediate layer is a hard wear resistant carbide material and the inner nitride layer cooperates with a cobalt enriched zone in a cobalt cemented carbide insert to more effectively support the other two layers.

1. Field of the Invention

Coated cemented carbide inserts have been effectively utilized in many metal removal applications for a number of years. Basically, they are composite materials prepared by chemical vapor depositing (CVD) processes which provide a thin layer or coating of a hard wear resistant material, for example, titanium carbide (TiC), on a hard metal substrate surface such as a tungsten cemented carbide (WC). In some instances, the TiC layer is preceded on the substrate by an underlayer of various materials, titanium nitride, TiN, for example, and an overlayer of TiN, aluminum oxide $Al_2O_3$ and the like. Multilayer inserts have found application in a broad range of metal cutting applications, and various layers and their materials may be selected to suit the particular metal removal application.

2. Description of the Prior Art

The manufacture of coated cemented carbide tools and inserts includes a number of chemical and physical requirements. The coating layers utilized must be chemically stable and physically wear resistant in various metal cutting and wearing applications. The composition and thickness of these coatings are quite relevant because they must not easily spall or crack, and, they must be securely bonded to and supported by the insert substrate. Titanium carbide layers, TiC, titanium nitride layers, TiN, titanium carbonitride layers, TiCN, and aluminum oxide layers $Al_2O_3$ in numerous combinations, structures, and ordered layers are known in the art. However, titanium carbide, TiC, has emerged as the predominant wear surface. Accordingly, titanium carbide layers have been laid down on various substrates by a number of different process to perform as a hard wear surface.

When there are two or more dissimilar layers, the kind of material in the first layer, and supporting relationship between the first layer and a cemented carbide substrate are most important from a structural point of view. Since TiC is the more important layer, its relationship to the cemented carbide substrate is critical. For this reason the TiC layer is usually found as a thinner layer next adjacent a cemented carbide substrate, particularly one containing TiC and some advantage is taken of the affinity of the two carbides. Because of the noted superiority of TiC layers as the predominant hard wear resistant layer, some attention has been given to ways and means to use thicker TiC layers and also additional individual layers of other materials which contribute to the effectiveness of the TiC layer. However, the result of the use of plural and thicker layers is a generally weakening of the structure.

With respect to adequately supporting the hard wear resistant outer layers on cemented carbide substrates, and effectively supporting more and thicker layers, recent improvements include a metallurgical gradation of the layers at their junctures which define transitional zones incorporating elements from each adjacent layer. In the case of a cobalt cemented carbide substrate this gradation relates to a surface zone or region of the substrate which is enriched in cobalt in that it contains a higher average concentration of cobalt than found elsewhere in the cemented carbide. It has been discovered that this enriched zone may be used not only to provide improved strength and bonding characteristics, but also to combine a first layer of a material other than TiC which contributes additionally to the structural integrity of subsequent layers.

SUMMARY OF THE INVENTION

Accordingly, the present invention in one preferred form discloses an improved high strength insert utilizing a thin first TiN coating or layer on an improved decarburized cobalt enriched zone in a cobalt cemented carbide substrate. This combination more effectively supports a multilayer coating of a TiC inner layer and an outer layer of TiN or $Al_2O_3$, with the TiC layer being of increased thickness.

THE DRAWINGS

Figure 2:
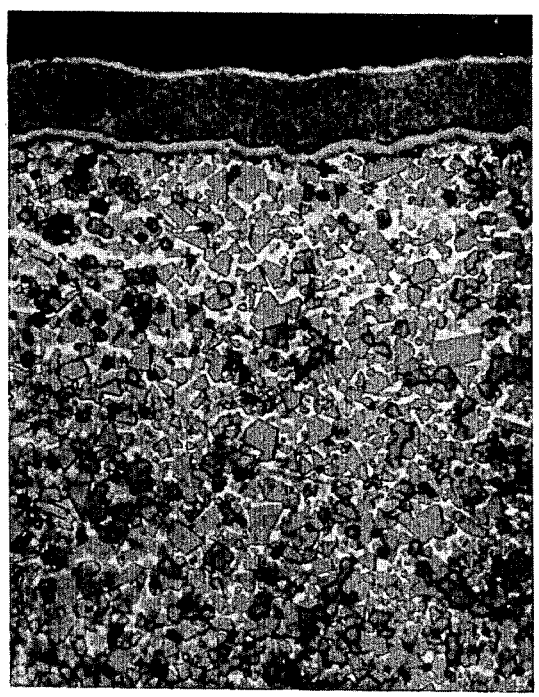

This invention will be better understood when taken in connection with the following description and the drawings in which:

FIG. 1 is a schematic cross sectional representation of one coated insert embodiment of this invention; and FIG. 2 is a photomicrograph of an insert indicating cobalt distribution in an enriched zone.

DESCRIPTION OF THE INVENTION

TiC and TiN coated carbide tools are surprisingly improved in comparative metal cutting applications where at least a three layer coating of TiN, TiC, and TiN or $Al_2O_3$ is deposited on a cobalt cemented tungsten carbide surface which has been cobalt enriched and decarburized.

In a preferred form of this invention, as illustrated in FIG. 1, there are three important interrelated contributing factors to an improved cutting tool, one example of which comprises (a) a decarburized cobalt enriched cemented carbide substrate 11, (b) a thin underlayer of TiN 12, and (c) following layers of a thick layer of TiC 13 and a thin layer of TiN 14 to provide a three layer combination of TiN, TiC and TiN. The TiC layer falls in the range of 6.0 to 12.0μ thickness while the TiN underlayer is from 0.10 to 3.0μ thick. The TiN outer layer may be replaced with an $Al_2O_3$ layer which in turn may be coated with TiN.

The cemented carbide substrate of the present invention may include a number of cemented carbide substrates of different compositions but preferably is a cobalt cemented tungsten carbide substrate of the following general proportions. 2-5 wt. % of TiC, 5-10 wt. % TaC, 5-10 wt. % Co, balance WC. An article is prepared by the usual powder metallurgy process and milling the powders, and pressing into compacts, and sintering at temperatures above the melting point of the cobalt phase.

The substrate of this invention incorporates a cobalt enriched zone at or adjacent to its outer surface. Examples of prior cobalt enrichment are found in U.S. Pat. Nos. 2,612,442 Goetzel, and copending application 489,286 filed Apr. 28, 1983, Yohe, each assigned to the same assignee as the present invention. As one example, a cobalt cemented carbide insert is subjected to elevated temperatures at above about the melting point of the cobalt in the substrate to cause the cobalt to progress, migrate or diffuse to a surface zone. The cobalt enriched surface zone is an important feature in the structural integrity of the insert of this invention. The cobalt enriched zone changes the hardness characteristics of the interface surface between the substrate and the adjacent coating, and provides a tougher surface.

A cobalt enriched zone has been achieved by various other processes in the cutting tool art, involving high temperature diffusion, or higher temperature melting and migration of the cobalt to the surface. However, not all cobalt enriched surfaces provide the same final result for a cutting tool insert. The kind of cobalt enrichment as well as the kind of next adjacent surface are quite important. For example, a co-extensive cobalt layer at the extreme outer surface of the substrate where it would be in direct engagement with a coating layer is undesirable and should either not be formed, or subsequently removed before a coating layer is deposited. Further, for the purposes of the present invention, the content of cobalt in the enriched zone should be at least about two times the average amount of cobalt in the substrate. A good example would be an enrichment of 2 to 3 times at a $20\mu$ depth. The overall depth of enrichment may reach $50\mu$ to $75\mu$.

One process for providing a cobalt enriched zone involves the addition of various compounds into the original cemented carbide powder mixture, prior to its pressing and sintering, which react to form a surface layer of tungsten carbide WC and cobalt Co, and an inner hard phase region containing a portion, defined as a B-1 type solid solution hard phase usually having a face centered cubic structure of the carbides IV a to VI a group transition metals in the Periodic Table such as (Ti, W) (C, N) in addition to the WC and Co. See U.S. Pat. Nos. 4,150,195 Tobioka and 4,277,283 Tobioka. For example, Ti(CN) as a solid solution is substituted for TiC in the cemented carbide formulation. When sintered in a vacuum, such materials yield a surface zone depleted in the so called B-1 cubic phase, and consequently enriched in cobalt and WC. The mechanism is believed to be a decomposition of the B-1 solid solution phase containing T, (CN) in vacuum to form titanium which is soluble in the liquid cobalt and is transported to the interior of the substrate.

In the improved process of the above noted Yohe application, the insert is treated with nitrogen during its manufacturing sintering operation so that the (W, Ti) C which it contains is nitrided. Nitrogen gas is injected into the sintering furnace during the heating part of the sintering cycle, in particular, during a holding period of from about 20 to about 180 minutes at a temperature of approximately 1200° to 1300° C. Higher temperature holds in nitrogen may be included subsequent to the initial 1200° to 1300° C. hold. The insert is subjected to vacuum conditions during this sintering process after nitrogen injection to promote diffusion of nitrogen out of the part, thus inducing a nitrogen gradient which sets up the cobalt enriched zone. Varying the conditions of nitrogen pressure, hold temperature, and hold time will affect the depth of the resulting B-1 phase depletion as well as the degree and depth of the cobalt enrichment. Zones up to 40 microns deep and cobalt enrichment to a level of about 15% (in a 6% nominal Co composition) have been produced by the following examples. The enrichment is defined as the zone having 15% more cobalt than the average found elsewhere in the insert. The following Example I is typical of the Yohe process.

Example I

A pressed powder insert composed of 83.0% WC, 6% TaC, 6% Co, and 5.0% ($W_{0.5}$ $Ti_{0.5}$) C by weight was placed in a vacuum-sintering furnace on a carbon coated graphite shelf. The part was heated in the conventional manner to remove wax and then heated to 1260° C. While it was being held at 1260° C., nitrogen gas was introduced at the rate of 3 liters/minute to a pressure of 600 Torr. After 45 minutes of this treatment, the nitrogen was evacuated and the furnace temperature was raised to 1445° C. for 100 minutes for sintering. Argon at a pressure of 2 Torr was injected to moderate cobalt loss while still allowing nitrogen diffusion. The inserts were then allowed to cool at the natural cooling rate (20–30 degrees/minute). The micrograph of FIG. 1 of the resulting surface region shows a 30-micron deep B-1 phase depleted layer with an increased cobalt concentration. FIG. 2 shows a plot of cobalt and titanium content versus depth below the surface as measured in a scanning electron microscope with energy-dispersive X-ray analysis. The cobalt is enriched to a peak level of 10% in the region where the titanium (B-1 phase) is depleted.

An advantage of the Yohe process is that the zone is produced in the sintering process alone, with separate control over the B-1 phase depletion depth and cobalt enrichment. Also, the nitrogen treatment method can avoid the formation of a pure cobalt surface layer which interferes with coating adhesion. The outer surface of the insert shows cobalt which is discontinuous over the surface rather than continued in the sense of being uninterrupted. The cobalt dispersion across the outer surface is similar to the cobalt dispersion found in a subsurface layer. The surface is as smooth and uniform as that prepared by conventional sintering techniques and fits well with current sintering practice.

The use of a cobalt enriched substrate with a TiN layer facilitates the use of certain multilayer coatings. These multilayer coated inserts include a substrate having one or more TiC, and TiN or $Al_2O_3$, layered coatings thereon in various combinations or gradations. One specific improved insert is the cobalt enriched substrate of this invention coated in series with TiN, TiC, and a final TiN layer or a final layer of aluminum oxide, $Al_2O_3$, as illustrated in FIG. 1.

Referring now to FIG. 1, an insert 10 usually of a tungsten cemented carbide contains a cobalt enriched zone 11 which may be produced by any of the practices indicated. Next adjacent the enriched zone 11 is a thin underlayer 12 of TiN of about 0.1 to $3.0\mu$ thick followed by a layer 13 of TiC which in turn is followed by a layer 14 of TiN or $Al_2O_3$. The TiC working layer 13 is deposited directly on the TiN layer according to the described processes. In such a combination the most essential layer is the TiC layer 13. It is the TiC layer 13, which is the layer which does most of the work involved. It is the hardest wear resistant layer and has been known to be the essential layer in the cutting tool insert art. It follows, therefore, that it is desirable for the TiC layer 13 to be as thick as possible, commensurate with the structural integrity of its bond to the substrate.

In the inserts of this invention, a marked structural improvement is achieved by the combination of a cobalt enriched zone and a thin TiN underlayer thereon deposited by CVD processes known in the art. The TiN layer serves two main purposes. It serves as a correlating medium between the cobalt enriched zone and the TiC adjacent layer and it acts as a barrier layer to diffusion of various materials found in the substrate. A direct deposition of TiC on the cobalt enriched substrate is attended by alloying of the enriched zone to an extent determined by the time and temperature characteristics of the process. Such alloying detracts from its ability to impart toughness to the cutting edge. The TiN underlayer serves as a barrier to this alloying. Because of the structural and bonding integrity of the TiN/cobalt zone relationship a much thicker TiC working layer can be employed. The use of the TiN underlayer of this invention is also believed to aid in the optimization of the composition and thickness of the enriched zone to provide a balance between toughness and deformation of the cutting edge and widening the range of usefulness of the insert of this invention. TiC layer as much as 10–15$\mu$ thickeness can be laid down by CVD processes on the TiN layer without any necessity of a gradation layer. For example, starting with a pure TiN layer, the process is sharply altered to provide a layer of TiC and thereafter the process is sharply altered to provide a thin layer of TiN. In the practice of this invention it is preferred that each layer TiN, TiC, TiN, of the coating be laid down as an independent layer.

While the TiN outer layer 14 which is golden in color may serve as identification means and is esthetically attractive, it serves a utilitarian purpose because of its demonstrable crater resistance wearing characteristics. See U.S. Pat. No. 3,717,496 Kieffer. It provides somewhat better lubricity properties than does the TiC. In this invention the envelopement of the TiC with TiN over and under layers provides dual or series lubricity, to the TiC layer first, and if it wears through, then to the WC substrate. Certain other metal materials with golden colors such as $Z_n$ and $Hf_fN$ or carbonitrides of these metals may also be employed.

Processes of vapor depositing the noted layers are well known in the art. U.S. Pat. No. 4,268,569 Hale discloses a process for depositing TiN and TiC on a substrate. For example, Hale discloses placing a cemented carbide substrate in a furnace at about 1100° C. and about 1 atmosphere pressure in a flowing atmosphere of $H_2$-50% $N_2$-3.5%, $TiCl_4$ to form a TiN layer. This substrate was then held for about 10 minutes at approximately 1100° C. and about 1 atmosphere pressure in a flowing atmosphere of $H_2$-5% $CH_4$-3.5%, $TiCL_4$ to form a coating of TiC.

In the process of providing a TiN coating by vapor deposition, it is desirable that the substrate be in a clean condition as known in the art. It is preferred that the surface be first decarburized by holding the insert at an elevated temperature of between about 1000° C. and 1050° C. in flowing $H_2$ to which optionally may be added about 2% to 5% $TiCl_4$. Such a process with the noted option however may form a very thin layer of from about 0.1 to 1.0$\mu$ thickness, on the substrate. The layer is presently believed to be a layer of material containing one or more of T, C, TiN, and TiCN and may contribute to a better bond for the TiN underlayer.

Copending application Ser. No. 331,367 Hale, assigned to the same assignee as the present invention, discloses a novel process for the deposition of $Al_2O_3$ on a TiC surface. Example 1 of the noted Hale application is repeated here as follows and denoted as Example II.

EXAMPLE II

A commercial cemented carbide cutting tool insert comprising 85.5% WC, 6% TaC, 2.5% TiC and 6% Co and coated with TiC of five microns thickness is subjected to the following sequence of steps in a furnace at temperature of 1050° C. and 1 atmosphere pressure:
1. 2 minutes in an atmosphere of $H_2$ and approximately 2% $TiCl_4$.
2. $NbCl_5$ vaporizer on 8 min. to 225° F., 3 min. hold—15 min. power off-cool.
3. 1 minute in an atmosphere of hydrogen—3.5% $CO_2$ to surface oxidize.
4. 10 minutes in an atmosphere of hydrogen—5% $AlCl_3$.
5. 60 minutes in an atmosphere of hydrogen 5% $AlCl_3$—7% $CO_2$.

This treatment resulted in a 3–4 microns $Al_2O_3$ coating which was firmly bonded to the TiC coated cemented carbide substrate, through a bonding layer approximately 0.2 microns thick.

The $Al_2O_3$ coating does not replace the TiC. It is a coating which enhances and supports the wear resistant characteristics of the TiC. The improvement in structural integrity brought about by the practices of this invention enables a more effective use of an additional coating. In this manner an outer coating of TiN may be applied to the $Al_2O_3$ caoting to provide the usual TiN advantages without weakening the structure.

A typical practice of this invention is given in the following Example III.

EXAMPLE III

A tungsten cemented carbide insert of the composition above described as preferred, having a cobalt enriched zone with cobalt enrichment in the range of 10 to 20 wt. % of metallic cobalt at a depth of about 20$\mu$ was decarburized by subjecting it, in a furnace to an elevated temperature of about 950° C. for about 1.5 hrs. in the presence of flowing hydrogen gas. Thereafter, with the furnace temperature of about 950° C. the insert was exposed to flowing $H_2, \approx 50\%$, $N_2 \approx 3\%$ $TiCl_4$, at a pressure of one atmosphere. After about 15 minutes a thin tenacious layer of TiN of golden color was formed on the insert.

The TiN layer was about 0.5–2$\mu$ thick. The temperature was then raised to about 1030° C. and the atmosphere changed to $H_2$, $\approx 5\%$ $CH_4$, $\approx 3\%$ $TiCl_4$. After about 3.5 hrs. a thicker tenacious layer of TiC of about 8$\mu$ to 10$\mu$ thick had formed on the TiC layer. The temperature was then lowered to about 950° C. and an atmosphere of $H_2$, $\approx 50\%$ N, $\approx 3\%$ $TiCl_4$ was used for about 15 minutes to obtain a golden color TiN layer on the TiC. Gas compositions are volume percent.

The above example has been employed to produce a great number of commercial, coated inserts which have been effectively employed in many metal cutting operations. Much of the comparative testing in this part of the coated insert art falls close to experimental error values and it is subject to question. A better test is a life test, i.e. a running test over a long period of time showing consistently good results. For example, commercial inserts of this invention with the thick TiC coatings of about 7μ are in large scale production and used in competition with inserts of others. Those inserts of others have a TiC layer of less thickness and generally utilize a significant Ti(CN) transition region between layers. Of 125 reports over a six month period, positive comparative remarks with regard to materials being cut and speed and feed factors were given at a ratio of 2 to 1 in favor of the inserts of this invention with the thicker carbide coating and the TiN underlayer. These factors are found predominately in the 300 to 700 sfpm range on such materials as cast iron and alloy steels.

While the cobalt enriched zone may be provided by various processes in the prior art. It is preferred, however, to have a cobalt enriched zone at least equivalent to that described herein, followed by a TiN transition layer next adjacent the cobalt enriched zone. This combination effectively supports a multi layer coating thereon as illustrated in FIG. 2.

Referring now to the photomicrograph of FIG. 2, there is disclosed a partial section of a coated insert of this invention showing from top to bottom a thin light colored layer of TiN 14, a relatively thick gray layer of TiC 13, a lighter gray layer of TiN 12, and the cobalt enriched substrate 11. The substrate gives the general impression of containing blocky granules of darker gray and intermediate gray color together with lighter gray areas which are cobalt areas 15. The cobalt areas become more concentrated next adjacent the TiN layer 12.

Although the present invention has been described with reference to the foregoing specification, many modifications, combinations and variations of the invention will be apparent to those skilled in the art in light of the above teachings, such as its application to other carbides and binder metals and other metallic substrates. It is therefore understood that changes may be made to the particular embodiments of the invention which are within the full intended scope of the invention as defined by the following claims.

I claim:

1. A cobalt cemented carbide insert having at least one surface adapted to be a wear resistant surface, said wear resistant surface comprising:
   (a) a cobalt enriched zone extending in depth from 0–75μ and containing essentially metallic cobalt in an amount of at least about 2 times the average amount in the substrate;
   (b) the enriched zone being discontinuous in cobalt on its outer surface, by having cobalt dispersion therein similar to that cobalt dispersion just below its surface; and
   (c) a thin first layer of TiN deposited on said surface.

2. The invention as recited in claim 1 wherein said cobalt enriched zone contains about 10 to 20 wt. % of metallic cobalt at about a 20μ depth TiN layer.

3. The invention as recited in claim 1 wherein a layer of TiC is deposited on said TiN layer.

4. The invention recited in claim 2 wherein a layer of TiN is deposited on said cobalt enriched zone.

5. The invention as recited in claim 3 wherein a layer of TiN is deposited on said TiC layer.

6. The invention as recited in claim 4 wherein a layer of TiN is deposited on said TiC layer.

7. The invention as recited in claim 4 wherein a layer of Al$_2$O$_3$ is deposited on said TiC layer.

8. The invention as recited in claim 4 wherein a layer of Al$_2$O$_3$ is deposited on said TiC layer.

9. The invention as recited in claim 3 wherein said TiC is in the range of 6.0μ to 12.0μ thickness.

10. The invention as recited in claim 3 wherein said first TiN layer is in the range of 0.1μ–3.0μ thickness.

11. A cobalt cemented carbide insert having at least one surface adapted to be a wear resistant surface, said wear resistant surface comprising:
   (a) a cobalt enriched zone extending in depth from 0–75μ and containing essentially metallic cobalt in an amount of at least about 2 times the average amount in the substrate;
   (b) the enriched zone being discontinuous in cobalt on its outer surface, by having cobalt dispersion therein similar to that cobalt dispersion just below its surface;
   (c) a decarburization layer on said cobalt enriched surface comprising a mixture of Ti, TiC, TiCN; and
   (d) a thin first layer of TiN deposited on said surface.

12. In a process of manufacturing a coated carbide cutting tool insert, the step of:
   (a) providing a cobalt cemented carbide substrate having adjacent one surface thereof a cobalt enriched zone extending in depth from 10 to 75μ and containing metallic cobalt in the amount of from 10 to 20% by weight;
   (b) decarburizing said surface by subjecting said surface to an elevated temperature in the presence of H$_2$;
   (c) vapor depositing a thin layer of TiN of from about 0.1–3.0μ thick on said preparation layer;
   (d) vapor depositing a thicker layer of TiC of from about 6.0–12.0μ thick on said TiN layer; and
   (e) vapor depositing a thinner layer of TiN on said TiC layer.

13. The process as recited in claim 12 where a layer of Al$_2$O$_3$ is vapor deposited on said TiC layer as a substitute for step e.

14. The process as recited in claim 13 where a thin layer of TiN is vapor deposited on said Al$_2$O$_3$ layer.

15. In a process of manufacturing a coated carbide cutting tool insert, the step of:
   (a) providing a cobalt cemented carbide substrate having adjacent one surface thereof a cobalt enriched zone extending in depth from 10 to 75μ and containing elemental cobalt in the amount of from 10 to 20% by weight;
   (b) decarburizing said surface by subjecting said surface to an elevated temperature in the presence of H$_2$ and TiCl$_4$ to provide a very thin preparation layer of from about 0.1 to 1.0μ thick and incorporating one or more of TiC and TiCN;
   (c) vapor depositing a thin layer of TiN of from about 0.1–3.0μ thick on said preparation layer;
   (d) vapor depositing a thicker layer of TiC of from about 6.0–12.0μ thick on said TiN layer; and
   (e) vapor depositing a thinner layer of TiN on said TiC layer.

* * * * *

UNITED STATES PATENT AND TRADEMARK OFFICE
CERTIFICATE OF CORRECTION

PATENT NO. : 4,497,874

DATED : February 5, 1985

INVENTOR(S) : Thomas E. Hale

It is certified that error appears in the above-identified patent and that said Letters Patent is hereby corrected as shown below:

Col. 1, line 54, the word "process" should be in the plural form --processes--.

Col. 2, line 65, delete the period "." after the word "proportions", and substitute therefor a colon ":".

Col. 3, line 53, delete the comma "," after the letter "T" and substitute therefor the letter "i".

Col. 4, line 26, delete "The micrograph of FIG. 1".

Col. 4, line 27, delete "of the resulting surface region shows".

Col. 4, line 27, delete "a" and substitute therefor --A--.

Col. 4, line 29, after the hyphenated word "centration", add the word "resulted".

UNITED STATES PATENT AND TRADEMARK OFFICE
CERTIFICATE OF CORRECTION

PATENT NO. : 4,497,874

DATED : February 5, 1985

INVENTOR(S) : Thomas E. Hale

It is certified that error appears in the above-identified patent and that said Letters Patent is hereby corrected as shown below:

Col. 4, line 29 to Col. 4, line 32, delete the sentence: "FIG. 2 shows a plot of cobalt and titanium content versus depth below the surface as measured in a scanning electron microscope with energy-dispersive X-ray analysis."

Col. 4, line 32, delete the word "is" and substitute therefor the word "was".

Col. 5, line 46, delete "$Z_n$" and substitute therefor "ZrN".

Col. 5, line 46, delete "$Hf_fN$" and substitute therefor "HfN".

Col. 5, line 54, delete the comma "," after the numeral "3.5%".

Col. 5, line 57, delete the comma "," after the numeral "3.5%".

UNITED STATES PATENT AND TRADEMARK OFFICE
CERTIFICATE OF CORRECTION

PATENT NO. : 4,497,874
DATED : February 5, 1985
INVENTOR(S) : Thomas E. Hale

It is certified that error appears in the above-identified patent and that said Letters Patent is hereby corrected as shown below:

Col. 5, line 58, correct the formula so that it reads "$TiCl_4$".

Col. 6, line 1, delete "T" and substitute therefor "Ti".

Col. 6, line 13, after the word "at" insert the word --a--.

Col. 6, line 35, correct the spelling of the word "coating".

Col. 6, line 49, delete the comma "," after "50%".

Col. 6, line 49, insert a comma --,-- after "$N_2$".

Col. 7, line 5, correct the spelling of the word "thickness".

Col. 7, line 58, after the word "depth" insert --from the--.

UNITED STATES PATENT AND TRADEMARK OFFICE
CERTIFICATE OF CORRECTION

PATENT NO. : 4,497,874

DATED : February 5, 1985

INVENTOR(S) : Thomas E. Hale

It is certified that error appears in the above-identified patent and that said Letters Patent is hereby corrected as shown below:

Col. 7, lines 61 and 62, delete Claim 4 in its entirety.

Col. 8, lines 1 and 2, delete Claim 6 in its entirety.

Col. 8, line 3, delete the numeral "4" and substitute therefor the numeral "3".

Col. 8, lines 5 and 6, delete Claim 8 in its entirety.

Signed and Sealed this

Twenty-ninth Day of October 1985

[SEAL]

Attest:

DONALD J. QUIGG

Attesting Officer

Commissioner of Patents and Trademarks—Designate